US006875515B2

(12) United States Patent
McNulty et al.

(10) Patent No.: US 6,875,515 B2
(45) Date of Patent: Apr. 5, 2005

(54) FUSED QUARTZ ARTICLE HAVING CONTROLLED DEVITRIFICATION

(75) Inventors: Thomas Francis McNulty, Ballston Lake, NY (US); David Charles Pender, Schenectady, NY (US); Victor Lien-Kong Lou, Schenectady, NY (US); Robert Arthur Giddings, Slingerlands, NY (US); Frederic Francis Ahlgren, Highland Heights, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,754

(22) Filed: May 10, 2002

(65) Prior Publication Data

US 2003/0211335 A1 Nov. 13, 2003

(51) Int. Cl.[7] ............................. B32B 9/00; C09D 1/00
(52) U.S. Cl. ...................... 428/432; 428/689; 428/697; 106/286.4; 106/286.6
(58) Field of Search ................................. 428/432, 426, 428/688, 689, 697; 106/286.1, 286.6, 287.1, 287.34; 501/4; 117/900; 65/33.1, 33.4, 33.5

(56) References Cited

U.S. PATENT DOCUMENTS

| 4,072,489 A | * | 2/1978 | Loxley et al. ............... 65/17.3 |
| 4,102,666 A | | 7/1978 | Baumler et al. |
| 5,053,359 A | | 10/1991 | Loxley et al. |
| 5,389,582 A | | 2/1995 | Loxley et al. |
| 5,976,247 A | * | 11/1999 | Hansen et al. .............. 117/200 |

FOREIGN PATENT DOCUMENTS

| EP | 0748885 | 12/1996 |
| EP | 0753605 | 1/1997 |
| JP | 63236722 | 10/1988 |
| JP | 63236723 | 10/1988 |
| JP | 2002029890 | 1/2002 |
| WO | WO 02/070414 | 9/2002 |

OTHER PUBLICATIONS

J. Appl. Phys., "*The Mechanism of Growth of Quartz Crystals Into Fused Silica*", VJ Fratello et al., vol. 51, No. 12, pp 6160–6164, Dec. 1980.
J. Appl. Phys., "*The Dependence of Growth rate of Quartz in Fused Silica on Pressure and Impurity Content*", VJ Fratello et al., vol. 51, No. 9, pp 4718–4728, Sep. 1980.
Journal of the American Ceramic Society, *Devitrification of High–$SiO_2$ Glasses of the System $Al_2O_3$–$SiO_2$* SD Brown et al., vol. 42, No. 6, pp 263–270, Jun. 1, 1959.
Translated from Fizika I Khimiya Stekla, "*Combined Effect of Impurity Oxides of Alkali Metals and Aluminum On the Viscosity of Vitreous Silica*", vol. 6, No. 5, pp 553–557, Sep.–Oct. 1980. Original article submitted Feb. 22, 1980.
PCT Search Report.

* cited by examiner

*Primary Examiner*—Deborah Jones
*Assistant Examiner*—G. Blackwell-Rudasill
(74) *Attorney, Agent, or Firm*—Andrew J. Caruso; Patrick K. Patnode

(57) ABSTRACT

A fused quartz article, such as a muffle tube or crucible, with enhanced creep resistance. The enhanced creep resistance is the result of controlled devitrification of the fused quartz article. Controlled devitrification is achieved by coating the article with a colloidal silica slurry doped with metal cations, such as barium, strontium, and calcium. The metal cations in the slurry promote nucleation and growth of cristobalite crystals into the fused quartz at temperatures in the range from about 1000° C. to about 1600° C. The cristobalite has significantly higher viscosity, and therefore greater creep resistance at elevated temperatures, than fused quartz. Methods for applying a doped coating to a fused quartz article and improving the creep resistance of a fused quartz article are also disclosed.

25 Claims, 1 Drawing Sheet

FUSED QUARTZ ARTICLE HAVING CONTROLLED DEVITRIFICATION

BACKGROUND OF THE INVENTION

The invention relates to an article formed from fused quartz. More particularly, the invention relates to an article comprising fused quartz and having an outer coating containing metal cations. Even more particularly, the invention relates to a fused quartz article having an outer coating containing metal cations, wherein the fused quartz undergoes a transition to a cristobalite crystal structure at a temperature of at least about 1000° C. The invention also relates to a method of coating a fused quartz article with a coating containing a plurality of metal cations.

Quartz (also referred to hereinafter as "fused quartz") is used to form articles, such as tubes and crucibles, which are used in the processing of products, such as optical fibers and semiconducting materials, at high temperatures. Quartz articles undergo viscous creep at high temperatures and are thus prone to failure. Quartz muffle tubes, for example, are used throughout the fiber optics industry during the sintering step in optical-quality glass boule production. In the sintering application, tubes are usually suspended vertically, and sintering takes place at temperatures around 1500° C. At such temperatures, the fused quartz muffle tubes undergo viscous creep, which can lead to muffle tube failure.

Fused quartz articles, such as muffle tubes and crucibles, have limited service lifetimes due to viscous creep occurring at high temperatures of operation. Therefore, what is needed is a fused quartz article that is resistant to creep at high temperatures. What is also needed is a method of treating a fused quartz article to improve the creep resistance of the article.

SUMMARY OF THE INVENTION

The present invention meets these and other needs by providing a fused quartz article, such as a muffle tube or crucible, with enhanced creep resistance. The enhanced creep resistance is the result of controlled devitrification of the fused quartz article. Controlled devitrification is achieved by coating the tubes with a colloidal silica slurry doped with metal cations, such as, but not limited to, barium, strontium, and calcium. The metal cations in the slurry promote nucleation and growth of cristobalite crystals (also referred hereinafter as "cristobalite") into the fused quartz at elevated temperatures. The cristobalite has significantly higher viscosity, and therefore greater creep resistance at elevated temperatures, than fused quartz.

Accordingly, one aspect of the invention is to provide a fused quartz article. The fused quartz article comprises: a body, the body comprising fused quartz; and a coating disposed on an exposed surface of the body, the coating comprising a plurality of metal cations, each having a valence of less than 4, wherein the plurality of metal cations comprises cations of at least one of an alkali metal, an alkaline earth metal, a rare earth metal, and combinations thereof. The plurality of metal cations is present within the coating in a concentration of at least about 0.1 atomic percent. The fused quartz within the body undergoes a transition to a cristobalite crystal structure at a temperature of at least about 1000° C.

A second aspect of the invention is to provide an outer coating for a fused quartz article. The outer coating comprises a plurality of metal cations, wherein the plurality of metal cations comprises cations of at least one of barium, calcium, strontium, and combinations thereof. The plurality of metal cations is present within the coating in a concentration of at least about 0.1 atomic percent. The plurality of cations catalyzes a transition of fused quartz within the fused quartz article to a cristobalite crystal structure at a temperature of at least about 1000° C.

A third aspect of the invention is to provide a fused quartz article. The fused quartz article comprises: a body comprising fused quartz; and an outer coating disposed on an exposed surface of the body, the outer coating comprising a plurality of metal cations, wherein the plurality of metal cations comprises cations of at least one of barium, calcium, strontium, and combinations thereof. The plurality of metal cations is present within the coating in a concentration of at least about 0.1 atomic percent. The plurality of cations catalyzes a transition of fused quartz within the body to a cristobalite crystal structure at a temperature of at least about 1000° C. The fused quartz article is transparent to visible light.

A fourth aspect of the invention is to provide a method of forming a doped coating on an exposed surface of a fused quartz article having a body comprising fused quartz and a doped coating disposed on an exposed surface of the body. The doped coating comprises a plurality of metal cations, each having a valence of less than 4, wherein the plurality of metal cations comprises cations of at least one of an alkali metal, an alkaline earth metal, a rare earth metal, and combinations thereof, and wherein the plurality of metal cations is present within the coating in a concentration of at least about 0.1 atomic percent. The method comprises the steps of: providing a silica slurry, the silica slurry being doped with a plurality of metal cations comprising cations of at least one of an alkali metal, an alkaline earth metal, a rare earth metal, and combinations thereof; providing a fused quartz article; applying the silica slurry to an exposed surface of the fused quartz article; drying the silica slurry on the exposed surface; and fire polishing the exposed surface to form the doped coating on the exposed surface.

A fifth aspect of the invention is to provide a method of improving the creep-resistance of a fused quartz article. The fused quartz article comprises a body of fused quartz and a coating disposed on an exposed surface of the body, wherein the coating comprises a plurality of metal cations, each having a valence of less than 4, wherein the plurality of metal cations comprises cations of at least one of an alkali metal, an alkaline earth metal, a rare earth metal, and combinations thereof, and wherein the plurality of metal cations is present within the coating in a concentration of at least about 0.1 atomic percent. The method comprises the steps of: providing a silica slurry, the silica slurry being doped with a plurality of metal cations comprising cations of at least one of an alkali metal, an alkaline earth metal, a rare earth metal, and combinations thereof; providing a fused quartz article; applying the silica slurry to an exposed surface of the fused quartz article; drying the silica slurry on the exposed surface; fire polishing the exposed surface, wherein the silica slurry, after drying, forms a coating on the outer surface; and nucleating cristobalite crystals at a temperature of at least about 1000° C. on the outer surface, wherein the cristobalite crystals enhance the creep resistance of the fused quartz article.

These and other aspects, advantages, and salient features of the present invention will become apparent from the following detailed description, the accompanying drawings, and the appended claims.

DETAILED DESCRIPTION

Figure 1:
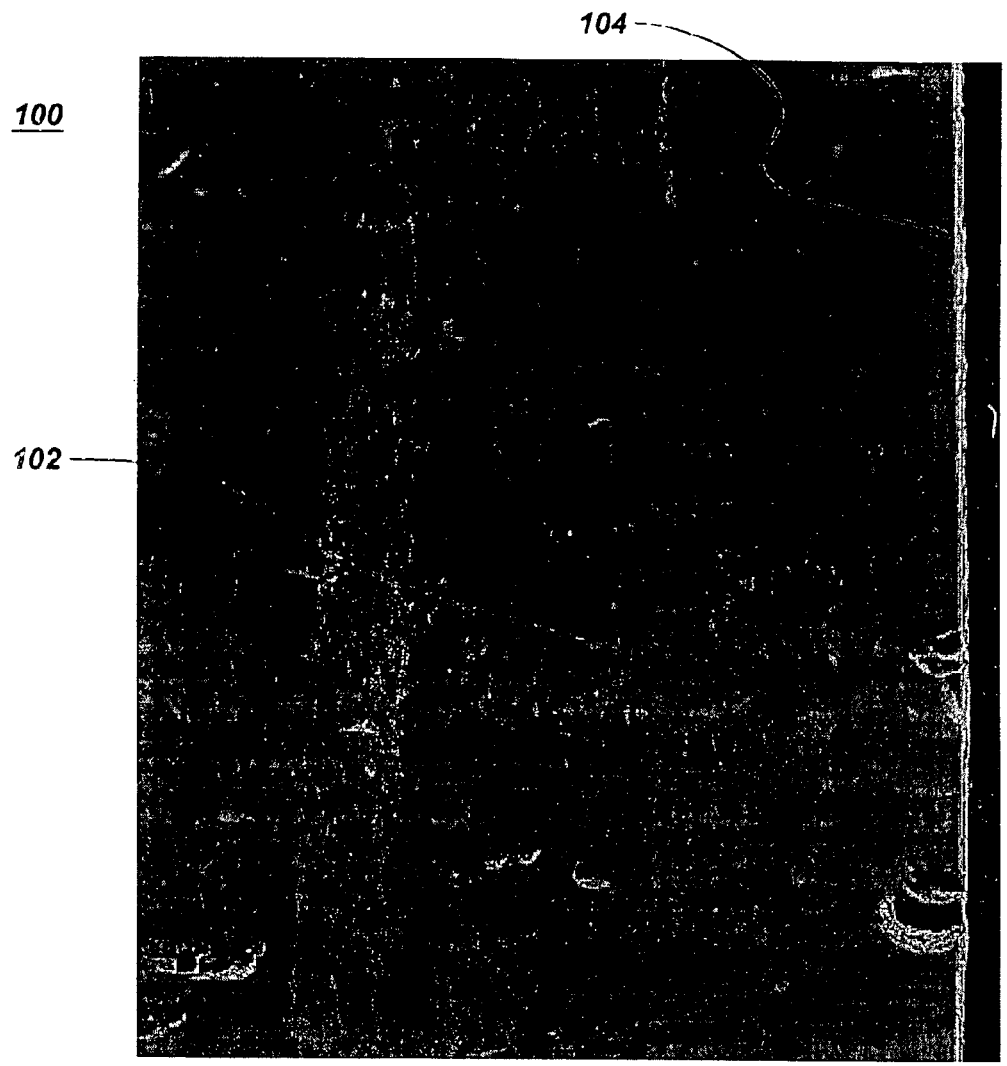
FIG. 1 is a micrograph, taken at 500× magnification, of a cross-section of a fused quartz muffle tube of the present invention.

In the following description, like reference characters designate like or corresponding parts throughout the several views shown in the figures. It is also understood that terms such as "top," "bottom," "outward," "inward," and the like are words of convenience and are not to be construed as limiting terms.

The present invention provides a fused quartz article having enhanced creep resistance at high temperatures. The improvement in creep resistance is the result of controlled devitrification of the fused quartz article. Controlled devitrification is achieved by coating the tubes with a colloidal silica slurry doped with cations of alkali metals, alkaline earth metals, and rare earth metals, such as, but not limited to, barium, strontium, and calcium. The metal cations in the slurry promote nucleation and growth of cristobalite crystals (also referred hereinafter as "cristobalite") into the fused quartz at elevated temperatures. The cristobalite has significantly higher viscosity, and therefore greater creep resistance at elevated temperatures, than fused quartz.

Referring to the drawings in general and to FIG. 1 in particular, it will be understood that the illustrations are for the purpose of describing a preferred embodiment of the invention and are not intended to limit the invention thereto. FIG. 1 is a cross-sectional representation of a portion of an article 100 of the present invention. Article 100, which may be, but is not limited to, a crucible, such as a crucible used in silicon wafer growth, or a fused quartz tube, such as a quartz muffle tubes used in the sintering of optical-quality glass boules, comprises a fused quartz body 102. Article 100 further includes coating 104, disposed on an exposed surface of fused quartz body 102. Coating 104 may comprise multiple coatings and may be disposed on more than one exposed surface of fused quartz body 102.

In one embodiment, article 100, fused quartz body 102, and coating 104 are all transparent to visible light (i.e., electromagnetic radiation ranging in wavelength from about 4000 angstroms to about 7700 angstroms). Transparency is a desirable feature of fused quartz article 100. In some applications, such as quartz muffle tubes, transparency permits viewing of the glass boule within the muffle tube during processing, as well as optical measurement of the boule temperature. In another embodiment, article 100 has a melting temperature that is at least that of cristobalite (about 2270° C.). In yet another embodiment, article 100 is substantially inert to chemical attack by halide gases and acids. "Substantially inert" is understood to mean that little or no reaction between article 100 and either halide gases or acids occurs over time.

Coating 104 comprises a plurality of metal cations, wherein each of the cations has a valence of less than 4, wherein the plurality of metal cations comprises cations of at least one of an alkali metal, an alkaline earth metal, a rare earth metal, and combinations thereof. The presence of the plurality of metal cations in the surface coating aids in the nucleation of cristobalite crystals on the surface of fused quartz body 102, and promotes rapid growth of these crystals into the bulk of fused quartz body 102. In the presence of the plurality of cations present in coating 104, fused quartz body undergoes a transition to the cristobalite crystal structure (also referred to hereinafter as "devitrification") at temperatures in a range from about 1000° C. to about 1600° C. More preferably, devitrification is carried out at a temperature in a range from about 1350° C. to about 1600° C. In one embodiment, the plurality of cations comprises at least one of the divalent alkaline earth cations (also known as Group II cations), such as the divalent cations of barium ($Ba^{2+}$), calcium ($Ca^{2+}$), strontium ($Sr^{2+}$), and combinations thereof. In another embodiment, the plurality of cations comprises barium ($Ba^{2+}$) cations. The plurality of cations is present within coating 104 in a concentration of at least about 0.1 atomic percent. In one embodiment, the concentration of the plurality of metal cations within coating 104 is at least 0.5 atomic percent. In another embodiment, the concentration of the plurality of metal cations within coating 104 is in the range from about 4 atomic percent to about 10 atomic percent. Coating 104 has a thickness in a range from about 50 nanometers to about 5 microns. In one embodiment, the thickness of coating 104 is in a range from about 500 nanometers to about 5 microns. In another embodiment, the thickness is in a range from about 2 microns to about 5 microns.

Coating 104 is applied to fused quartz body 102 by spraying a slurry containing the plurality of metal cations onto the exposed surface of fused quartz body 102 to first form a film. The slurry is generally formed by first dissolving a salt of the metal to generate a solution containing a plurality of metal cations. The solution is then combined with fumed silica to form the slurry. Silica is added to control the final cation concentration at the exposed surface and to facilitate binding of the cation "dopant" to the surface via subsequent flame polishing. The slurry is then sprayed onto the exposed surface of fused quartz body 102. The film is then flame-polished to yield a dense, transparent surface coating 104. Subsequent heat treatment of the article 100, now comprising coating 104 and fused quartz body 102, results in devitrification—or conversion to the cristobalite crystal structure—of the fused quartz body.

At elevated temperatures, fused quartz exhibits significant viscous creep. Fused quartz articles, such as muffle furnace tubes that are used in the sintering of fiber optic materials, are frequently maintained at high temperatures for prolonged periods of time. The creep rate is greatly diminished by the rapid crystallization, which originates at the location of the metal cations in coating 104, of the fused quartz. The reduction in creep rate extends the lifetime of article 100.

Quartz muffle tubes, for example, are used in the fiber optics industry during the sintering step in the production of optical-quality glass boules. The tubes are usually suspended vertically, and sintering takes place at a temperature of about 1500° C. At such temperatures, fused quartz undergoes viscous creep, which can lead to muffle tube failure. The creep properties of the muffle tube are greatly improved by producing a controlled devitrified layer of cristobalite on the outer diameter of the muffle tube. The presence of this crystalline outer layer extends the projected service time of such tubes to greater than one year in some cases.

The present invention also includes a method of forming a doped coating on an exposed surface of a fused quartz article. First, a fused quartz article and a slurry of fused silica containing a dopant comprising a plurality of metal cations comprising cations of at least one of an alkali metal, an alkaline earth metal, a rare earth metal, and combinations thereof, with each cation having a positive valence of less than 4, are provided. The slurry is prepared by first preparing an aqueous solution of an inorganic compound that comprises the metal cation dopant. For example, a soluble barium compound, such as barium nitrate, is dissolved in water, the solution is then mixed with colloidal silica to form the silica slurry. The concentration of the metal cation dopant is present within the silica slurry in a concentration range from about 13 ppm (parts per million) to about 2000 ppm. In one embodiment, the concentration of the metal cation dopant is present within the silica slurry in a concentration range from about 800 ppm to about 2000 ppm. The silica slurry is then applied to an exposed surface of the fused quartz article, typically by spraying the slurry onto the exposed surface, and allowed to dry, forming a film on the exposed surface. Alternatively, other application techniques known in the art, such as, but not limited to, painting and dipping, may be used to apply the slurry to the exposed surface of the fused quartz article. Additionally, the fused quartz article may be preheated to a temperature in a range from about 50° C. to about 70° C. The preheating step increases the evaporation rate of water from the slurry and helps produce a smooth, conformal, doped coating. After drying, the film is flame-polished to yield a dense, transparent surface coating that is doped with metal cations.

The present invention further includes a method for improving the creep resistance of a fused quartz article. First, a fused quartz article and a slurry of fused silica containing a dopant comprising a plurality of metal cations comprising cations of at least one of an alkali metal, an alkaline earth metal, a rare earth metal, and combinations thereof, with each cation having a positive valence of less than 4, are provided. The slurry is prepared by first preparing an aqueous solution of an inorganic compound that comprises the metal cation dopant. For example, a soluble barium compound, such as barium nitrate, is dissolved in water, the solution is then mixed with colloidal silica to form the silica slurry. The concentration of the metal cation dopant is present within the silica slurry in a concentration range from about 13 ppm (parts per million) to about 2000 ppm. In one embodiment, the concentration of the metal cation dopant is present within the silica slurry in a concentration range from about 800 ppm to about 2000 ppm. The slurry is then applied to an exposed surface of the fused quartz article, typically by spraying the slurry onto the exposed surface and allowed to dry, forming a film on the exposed surface. Alternatively, other application techniques known in the art, such as, but not limited to, painting the slurry onto the exposed surface and dipping the fused silica article into a bath containing the slurry, may be used to apply the slurry to the exposed surface of the fused quartz article. Additionally, the fused quartz article may be preheated to a temperature in a range from about 50° C. to about 70° C. The preheating step increases the evaporation rate of water from the slurry and helps produce a smooth, conformal, doped coating. After drying, the film is flame-polished to yield a dense, transparent surface coating. The coated fused silica article is then heated to a temperature in a range from about 1000° C. to about 1600° C., and, preferably, in a range from about 1350° C. to about 1600° C., to form cristobalite crystals on the exposed surface of the fused quartz article. Preferably, devitrification of the coated fused silica article is carried out at a temperature of about 1350° C. The cristobalite crystals enhance the creep resistance of the fused quartz article.

The following example serves to illustrate the features and advantages of the present invention.

EXAMPLE 1

A fused quartz tube, having an outer diameter of 32 mm and an inner diameter of 24 mm, was coated with a barium-doped silica coating. In order to fuse the barium dopant onto the surface of the fused quartz, barium nitrate first was dissolved in water and mixed with colloidal silica to form a suspension. The amount of barium nitrate in the suspension was sufficient to provide about 4.5 atomic % barium substituted on the silicon sites within the coating following flame polishing. The silica was added to control the final barium concentration at the surface and also facilitate binding of the dopant to the surface via subsequent flame polishing. The colloidal silica was mixed into de-ionized water and adjusted to a pH of 1.0 by adding nitric acid to the solution. The resultant suspension contained 2.0 volume % colloidal silica. The coatings were applied to the outer surface of the tube using a pneumatic spray gun. The as-sprayed coating thickness was about 10 microns prior to flame polishing. The barium-doped colloidal silica coating was fused to the surface using a hydrogen burner attached to a glass-working lathe. The tube rotation rate was about 5 rpm, with the burner translating across the tube at approximately 12 inches/minute. A total of 3 coats were applied to the tube. Final coating thickness was in the range from about 5 microns to about 10 microns. Following coating, the tube was annealed at 1100° C. for 30 minutes.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

What is claimed is:

1. A fused quartz article, said fused quartz article comprising:
   a) a body, said body comprising fused quartz; and
   b) a coating disposed on an exposed surface of said body, said coating comprising a plurality of metal cations, each having a valence of less than 4, wherein said plurality of metal cations comprises cations of at least one of an alkali metal, an alkaline earth metal, a rare earth metal, and combinations thereof, wherein said plurality of metal cations is present within said coating in a concentration of at least about 0.1 atomic percent, wherein fused quartz within the bulk of said body undergoes a transition to a cristobalite crystal structure at a temperature in a range from about 1000° C. to about 1600° C., and wherein said fused quartz article is transparent to visible light.

2. The fused quartz article according to claim 1, wherein said fused quartz article is one of a furnace tube and a crucible.

3. The fused quartz article according to claim 1, wherein said fused quartz article is substantially chemically inert with respect to halide gases and acids.

4. The fused quartz article according to claim 1, wherein said fused quartz article has a melting temperature of at least that of cristobalite.

5. The fused quartz article according to claim 1, wherein said coating has a thickness from about 50 nm to about 5 microns.

6. The fused quartz article according to claim 5, wherein said coating has a thickness from about 500 nm to about 5 microns.

7. The fused quartz article according to claim 6, wherein said coating has a thickness from about 2 microns to about 5 microns.

8. The fused quartz article according to claim 1, wherein said plurality of cations comprises cations of at least one of barium, calcium, strontium, and combinations thereof.

9. The fused quartz article according to claim 1, wherein said at least one metal cation is present within said coating in a concentration of at least about 0.5 atomic percent.

10. The fused quartz article according to claim 9, wherein said at least one metal cation is present within said coating in a concentration from about 4 atomic percent to about 10 atomic percent.

11. An outer coating for a body comprising fused quartz, said outer coating comprising a plurality of metal cations, wherein said plurality of metal cations comprises cations of at least one of barium, calcium, strotium, and combinations thereof, and wherein said plurality of metal cations is present within said coating in a concentration of at least about 0.1 atomic percent, wherein said plurality of cations catalyzes a transition of fused quartz within the bulk of said body to a cristobalite crystal structure at a temperature in a range from about 1000° C. to about 1600° C., and wherein said body is transparent to visible light.

12. The outer coating according to claim 11, wherein said outer coating has a thickness from 50 nm to about 5 microns.

13. The outer coating according to claim 12, wherein said outer coating has a thickness from 500 nm to about 5 microns.

14. The outer coating according to claim 13, wherein said outer coating has a thickness from about 2 microns to about 5 microns.

15. The outer coating according to claim 11, wherein said at least one metal cation is present within said coating in a concentration of at least about 0.5 atomic percent.

16. The outer coating according to claim 15, wherein said least plurality of metal cations is present within said outer coating in a concentration of from about 4 atomic percent to about 10 atomic percent.

17. A fused quartz article, said fused quartz article comprising:
 a) a body, said body comprising fused quartz; and
 b) an outer coating disposed on an exposed surface of said body, said outer coating comprising a plurality of metal cations, wherein said plurality of metal cations comprises cations of at least one of barium, calcium, strontium, and combinations thereof, wherein said plurality of metal cations is present within said coating in a concentration of at least about 0.1 atomic percent, wherein said plurality of cations catalyzes a transition of fused quartz within the bulk of said body to a cristobalite crystal structure at a temperature a temperature in a range from about 1000° C. to about 1600° C., and wherein said fused quartz article is transparent to visible light.

18. The fused quartz article according to claim 17, wherein said fused quartz article is one of a furnace tube and a crucible.

19. The fused quartz article according to claim 17, wherein said fused quartz article is substantially chemically inert with respect to halide gases and acids.

20. The fused quartz article according to claim 17, wherein said fused quartz article has a melting temperature of at least that of cristobalite.

21. The fused quartz article according to claim 17, wherein said outer coating has a thickness from about 50 nm to about 5 microns.

22. The fused quartz article according to claim 21, wherein said outer coating has a thickness from about 500 nm to about 5 microns.

23. The fused quartz article according to claim 22, wherein said outer coating has a thickness from about 2 microns to about 5 microns.

24. The fused quartz article according to claim 17, wherin said at least one metal cation is present within said coating in a concentration of at least about 0.5 atomic percent.

25. The fused quartz article according to claim 24, wherein said plurality of metal cations is present within said outer coating in a concentration from about 4 atomic percent to about 10 atomic percent.

* * * * *